(12) United States Patent
Chen et al.

(10) Patent No.: US 7,279,359 B2
(45) Date of Patent: Oct. 9, 2007

(54) HIGH PERFORMANCE AMINE BASED NO-FLOW UNDERFILL MATERIALS FOR FLIP CHIP APPLICATIONS

(75) Inventors: Tian-An Chen, Phoenix, AZ (US); Daoqiang Lu, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/949,995

(22) Filed: Sep. 23, 2004

(65) Prior Publication Data

US 2006/0060987 A1 Mar. 23, 2006

(51) Int. Cl.
*H01L 21/44* (2006.01)
(52) U.S. Cl. .................... 438/108; 438/127
(58) Field of Classification Search .......... 438/108, 438/124, 126, 127
See application file for complete search history.

(56) References Cited

U.S. PATENT DOCUMENTS 5,985,043 A * 11/1999 Zhou et al. ............... 148/24

6,667,194 B1 * 12/2003 Crane et al. ............... 438/127

* cited by examiner

*Primary Examiner*—Hung Vu
(74) *Attorney, Agent, or Firm*—Blakely, Sokoloff, Taylor & Zafman LLP (57) ABSTRACT

Amine-based no-flow underfill materials and a method to produce flip-chip devices electrically bonded to a substrate are described. The no-flow underfill material includes an amine-based curing agent and a fluxing agent, which activates at a fluxing temperature and is neutral at the temperatures lower than the fluxing temperature. The fluxing agent of the no-flow underfill material heated to the activation temperature generates a reactive acid in-situ during chip attachment process to facilitate joint formation. The no-flow underfill material is formed on the substrate. A chip is placed on the no-flow underfill material formed on the substrate. A temperature is increased to activate the fluxing agent. The temperature is further increased to form conductive joints between the chip and the substrate. Further, the no-flow underfill material is cured. The conductive joints between the chip and the substrate may be lead-free.

13 Claims, 7 Drawing Sheets

HIGH PERFORMANCE AMINE BASED NO-FLOW UNDERFILL MATERIALS FOR FLIP CHIP APPLICATIONS

FIELD

The present invention relates to integrated circuit devices, and more specifically, to semiconductor chip packaging.

BACKGROUND

Figure 1A:
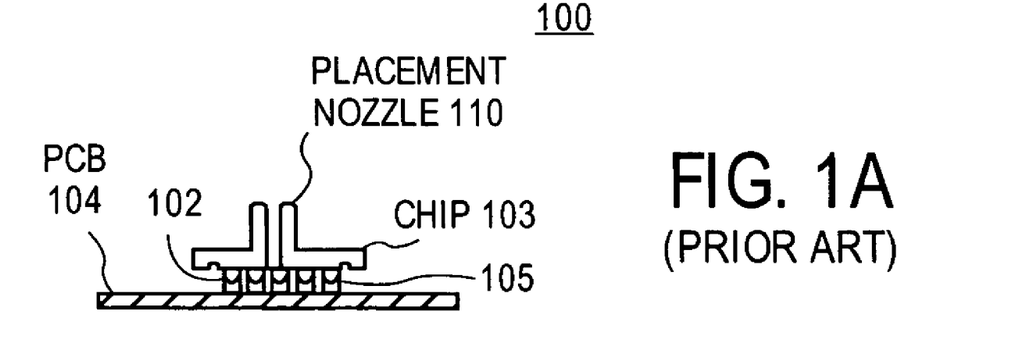
FIG. 1 is a flowchart of a typical prior art capillary underfill process for flip-chip assemblies.
Figure 1B:
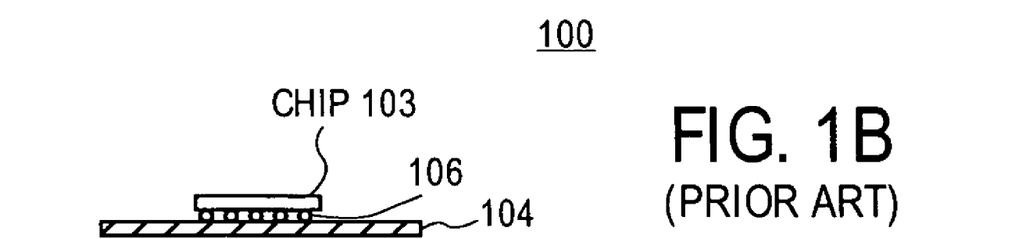
Figure 1C:
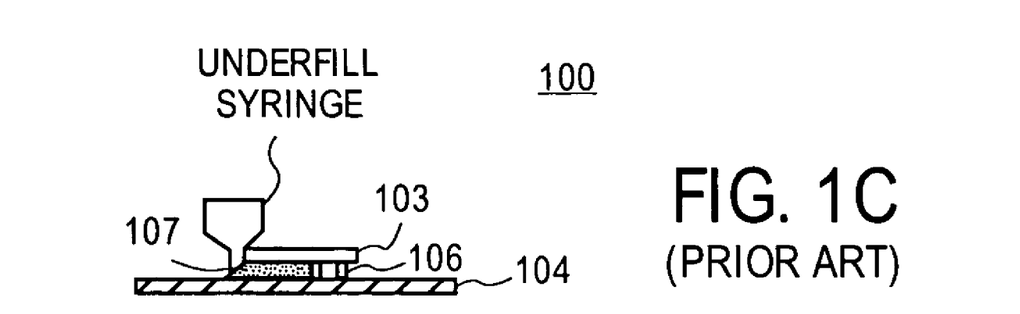
Figure 1D:
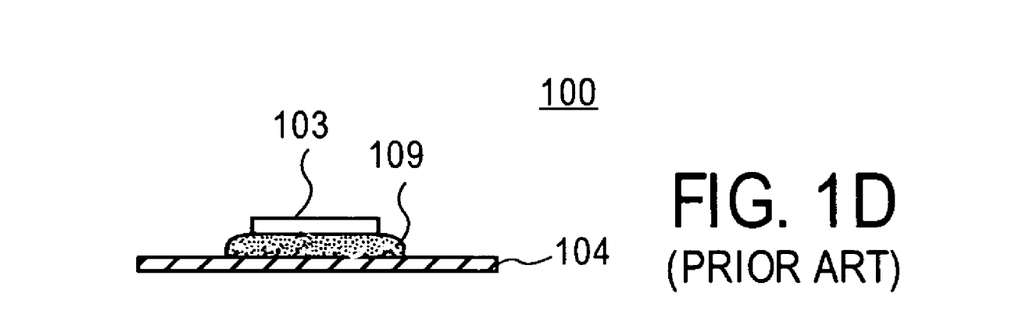

Since the inception of Chip Scale Packages ("CSPs") and flip chips, the increasing demand for smaller electronic component packages has intensified the focus on related manufacturing processes to find methods to increase their reliability. The capillary underfill process was developed to provide the necessary thermo-mechanical reinforcement to mitigate the coefficient thermal expansion ("CTE") mismatch, thus preventing early failure of the devices. The CTE is the difference in expansion and contraction between a board and a semiconductor chip, which weakens the solder joints and induces stress on the chip and on the board. Underfill material, typically epoxy adhesive, absorbs the stress induced by the CTE mismatch, secures and stabilizes the chip to the board. FIGS. 1A-1D illustrate a typical prior art capillary underfill process for flip-chip assembly 100. As shown in FIG. 1A, a chip 103 having conductive bumps 102 is placed using the placement nozzle 110 on a printed circuit board ("PCB") 104, such that the bumps 102 are aligned over the conductive pads 105 of the PCB 104. Prior to alignment, to help soldering conductive bumps 102 of a chip 103 to the PCB 104, a flux material is applied to conductive pads 105 of a PCB 104. The bumps 102 made of eutectic alloy provide electrical connection between a chip circuitry and the conductive pads 105 of the PCB 104. Next, reflow soldering is applied, bumps 102 are melted to form solder joints 106 to conductive pads 105 of the PCB 104, as shown in FIG. 1B, enabling an electrical connection between the circuitry of the chip 103 and the PCB 104. Further, as shown in FIG. 1C, a capillary underfill material 107 is dispensed in the space between the chip 103 and the PCB 104, which are already bonded together by solder joints 106. Prior to the capillary underfill material application, the assembly 100 may be cleaned to remove residuals of the soldering process and may be preheated to improve the flow characteristics of the capillary underfill. Thereafter, as shown in FIG. 1D, the capillary underfill material 107 is dispensed along one or two edges of the chip 103 and is allowed to flow, by capillary action, between the chip 103 and the PCB 104 through a small gap. The capillary underfill material helps to reduce strain induced on the solder joints, on the chip and on the PCB by CTE mismatch. Next, the capillary underfill material 107 is cured in a batch or re-flow oven at elevated temperature over an extended period of time to form polymerized adhesive protective layer 109 between the chip 103 and the PCB 104, as shown in FIG. 1D. Typical capillary underfill materials include epoxy resin and amine-based, anhydride-based, or phenol-based epoxy curing agents.

The capillary underfill process, however, becomes a time consuming and costly part of the manufacturing process. The process requires labor intensive steps such as application of a flux material to help soldering the bumps of the chip to the pads of the PCB, cleaning the assembly after soldering, dispensing capillary underfill, and then curing the capillary underfill. Capillary underfill process is used to protect structures after the chip and PCB are bonded together with solder joints. However, reflow soldering and subsequent cooling down of the assembly to form solder joints before applying the underfill material introduces additional stress to the chip, solder joints, and the PCB that can lead to premature device failure.

No-flow underfill process eliminates lengthy capillary flow times and combines fluxing, soldering and underfilling together. Solder joints are reflowed while fluxing and polymerization of the no-flow underfill takes place, because fluxing agent is already incorporated into the no-flow underfill material. Currently, because anhydrides and phenol-based materials do not react with free organic acids, they are used together with a free organic acid as a fluxing agent to form the non-flow underfill. Amine-based materials are not utilized to form the non-flow underfill, because a free reactive acid of the fluxing agent reacts with amine-based materials that prematurely destroys the fluxing agent. Unfortunately, anhydride and phenol based no-flow underfill materials have poor reliability, in particular at high temperatures, for example, fail in highly accelerated stress tests ("HAST") and in temperature cycling tests from −55° C. to 125° C. ("TCB") that compromises their ability to protect the devices.

BRIEF DESCRIPTION OF THE DRAWINGS

The invention may be best understood by referring to the following description and accompanying drawings that are used to illustrate embodiments of the invention. In the drawings.

DETAILED DESCRIPTION

In the following description, numerous specific details, such as specific materials, dimensions of the elements, temperatures, etc. are set forth in order to provide thorough understanding of one or more of the embodiments of the present invention. It will be apparent, however, to one of ordinary skill in the art that the one or more embodiments of the present invention may be practiced without these specific details. In other instances, semiconductor fabrication processes, techniques, materials, equipment, etc., have not been described in great details to avoid unnecessarily obscuring of this description. Those of ordinary skill in the art, with the included description, will be able to implement appropriate functionality without undue experimentation.

While certain exemplary embodiments of the invention are described and shown in the accompanying drawings, it is to be understood that such embodiments are merely illustrative and not restrictive of the current invention, and that this invention is not restricted to the specific constructions and arrangements shown and described because modifications may occur to those ordinarily skilled in the art.

Reference throughout the specification to "one embodiment", "another embodiment", or "an embodiment" means that a particular feature, structure, or characteristic described in connection with the embodiment is included in at least one embodiment of the present invention. Thus, the appearance of the phrases "for one embodiment" or "for an embodiment" in various places throughout the specification are not necessarily all referring to the same embodiment. Furthermore, the particular features, structures, or characteristics may be combined in any suitable manner in one or more embodiments.

Moreover, inventive aspects lie in less than all the features of a single disclosed embodiment. Thus, the claims following the Detailed Description are hereby expressly incorporated into this Detailed Description, with each claim standing on its own as a separate embodiment of this invention. While the invention has been described in terms of several embodiments, those skilled in the art will recognize that the invention is not limited to the embodiments described, but can be practiced with modification and alteration within the spirit and scope of the appended claims. The description is thus to be regarded as illustrative rather than limiting.

High performance no-flow underfill materials and methods to fabricate reliable flip chip devices are described herein. A no-flow underfill material includes a fluxing agent. The fluxing agent of the no-flow underfill material activates when heated to an activation temperature ("fluxing temperature") and is inactive ("neutral") at temperatures lower than the activation temperature. The fluxing agent of the no-flow underfill material acts as a flux at the activation temperature to generate a reactive acid in-situ during chip attachment process to remove metal oxides and facilitate conductive joint formation. At temperatures lower than the activation temperature, for example, at storage temperatures, the fluxing agent of the no-flow underfill material is not activated. The no-flow underfill material includes the amine-based epoxy hardener and the fluxing agent, which is inactive at temperatures below the fluxing temperature such that the amine-based no-flow underfill material is protected from degradation.

The no-flow amine-based underfill material having the fluxing agent that does not activate until heated to a predetermined activation temperature and having high adhesion to different substrates, high moisture resistivity, and high fractural toughness has demonstrated excellent reliability on JEDEC ("The standardization body of the Electronic Industries Alliance trade association") level in 260° C. preconditioning, in high temperature lead-free solder reflow, highly accelerated stress test ("HAST") and in temperature cycle test from −55° C. to 125° C. ("TCB") that was impossible to achieve with any of prior art no-flow underfill materials.

Figure 2:
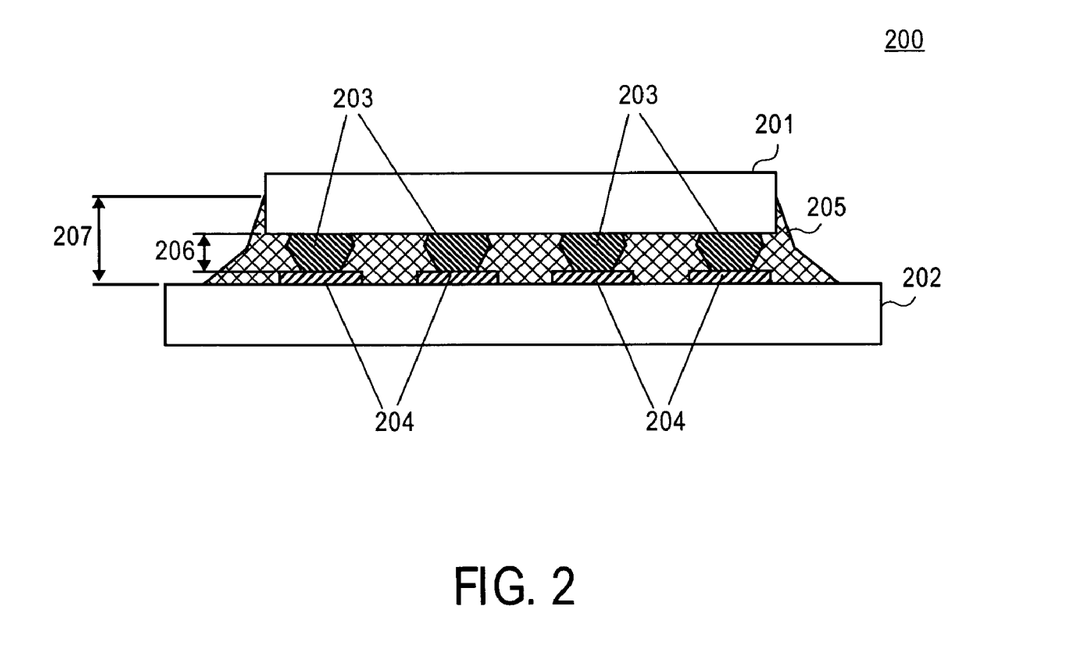
FIG. 2 is a side view of a flip chip assembly having a chip attached to a substrate with a no-flow underfill material according to one embodiment of the invention.

FIG. 2 is a side view of a flip chip assembly 200 having a chip 201 attached to a substrate 202 with a no-flow underfill material 205 according to one embodiment of the invention. As shown in FIG. 2, the chip 201 has contacts ("conductive bumps") 203 that are bonded to conductive pads 204 of the substrate 202 and a no-flow underfill material 205 fills a space between the chip 201 and the substrate 202. The no-flow underfill material 205 secures the chip 201 on the substrate and absorbs stresses and strains that may originate from the CTE mismatch of different components of the assembly 200, such as, for example, silicon material of the chip and different materials of the PCB board. The no-flow underfill material 205 includes an epoxy resin, an epoxy hardener ("curing agent"), and a fluxing agent, which is not activated until the fluxing temperature is reached. For one embodiment, the epoxy hardener of the no-flow underfill material 205 includes an amine-based hardener and the fluxing agent of the no-flow underfill material 205 includes at least one of a hindered acid, a hindered anhydride, a polymer encapsulated acid, a polymer encapsulated anhydride, or any combination thereof. For another embodiment, the hindered acid or anhydride of the fluxing agent of the no-flow underfill material 205 may be a stereo hindered acid or anhydride. More specifically, the fluxing agent may include, for example, one of ester, amide, and anhydride organic compounds that are not acids, but may be decomposed into the acid when heated to a predetermined activation temperature. For one embodiment, the predetermined activation temperature of the fluxing agent of the no-flow underfill material 205 is in the approximate range of 150° C. to 240° C.

Figure 3:
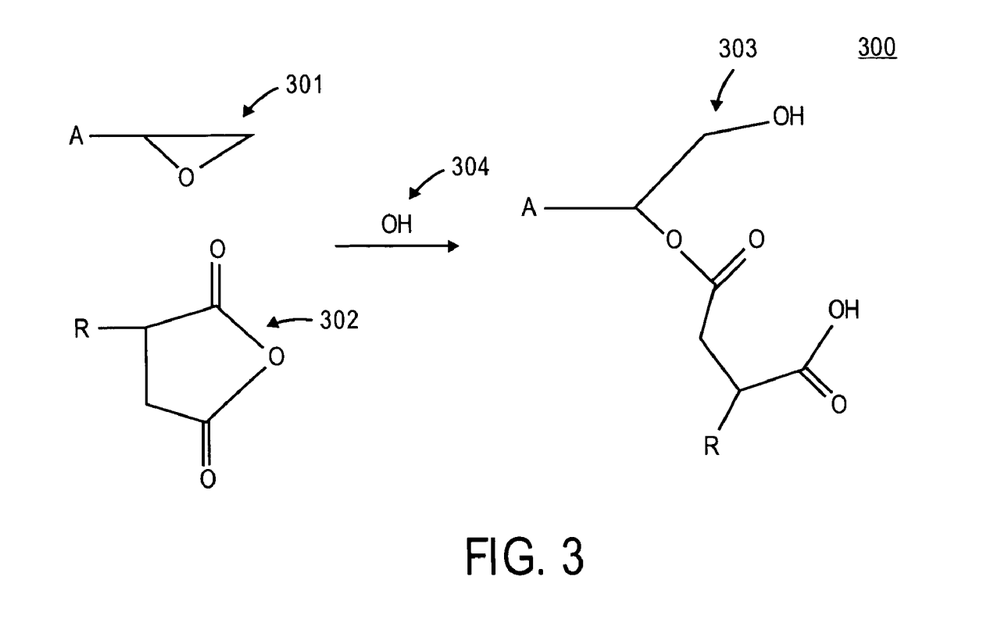
FIG. 3 illustrates an exemplary reaction between hindered anhydride of the no-flow underfill material and an epoxy group to form a reactive acid to remove metal oxide according to one embodiment of the invention.

FIG. 3 illustrates an exemplary reaction 300 between a hindered anhydride 301 of the no-flow underfill material 205 and an epoxy group 302 to form a free reactive acid 303 to remove metal oxide according to one embodiment of the invention. As illustrated in FIG. 3, the hindered anhydride 301 of the fluxing agent at the activation temperature $T_{flux}$ selectively reacts with epoxy group 302 in the presence of hydroxyl groups 304 of the no-flow underfill material 205 to form a free reactive acid 303, which acts as a flux. For another embodiment, the fluxing agent of the no-flow underfill material 205 may be incorporated into one or more capsules.

Figure 4:
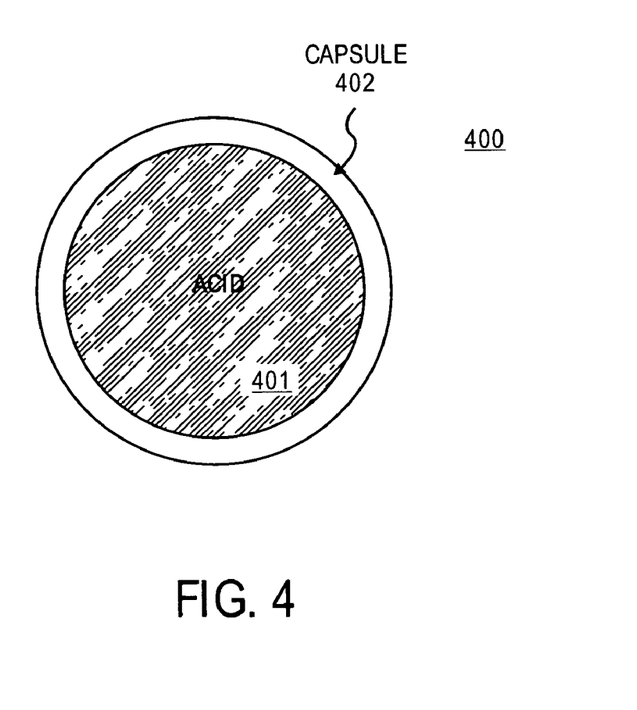
FIG. 4 illustrates a fluxing agent of the no-flow underfill material incorporated into a capsule according to another embodiment of the invention.

FIG. 4 illustrates a fluxing agent 400 of the no-flow underfill material 205 incorporated into a capsule according to another embodiment of the invention. As shown in FIG. 4, an acid 401 is enclosed inside a small capsule 402. The acid 401 is latent unless heated to a fluxing temperature. When heated to a fluxing temperature, the capsule 402 breaks, for example, by melting, and releases the reactive acid 401, which acts as a flux. For one embodiment, the acid 401 may be one of organic acids. More specifically, the acid 401 may be one of a carboxylic acid group, for example, tartaric acid. For one embodiment, the capsule 402 may include a polymeric film, or polymeric membrane. More specifically, the capsule 402 may include one of a polyurethane, a polyester, a Poly Vinyl Alcohol ("PVA"), or any combination thereof. For one embodiment, the capsule 402 may be prepared using emulsion polymerization. For an embodiment, the size of the capsule 402 during emulsion polymerization may be controlled to be in the approximate range of 1 nanometers ("nm") to 10 microns ("µm") by using one of the techniques known to one ordinary skill in the art of polymerization.

Figure 5:
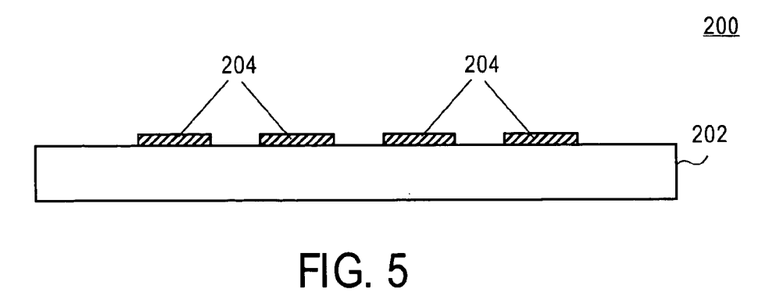
FIG. 5 is a side view of a substrate to form a flip chip assembly according to one embodiment of the invention.

FIG. 5 is a side view of the substrate 202 to form the flip chip assembly 200 according to one embodiment of the invention. As shown in FIG. 5, conductive pads 204 are formed on the substrate 202 to provide conductive coupling. The substrate 202 to form the flip-chip assembly 200 may include ceramic, epoxy, or other polymer materials to mount an integrated circuit. For one embodiment, the substrate 202 having one or more conductive pads 204 may form a part of the printed circuit board ("PCB"). For another embodiment, the substrate 202 having one or more conductive pads 204 may be a part of a device package substrate. For yet another embodiment, the substrate 202 having one or more conductive pads 204 may be a motherboard of a computer. For one embodiment, the conductive pads 204 of the substrate 202 include a lead-free conductive material. For another embodiment, the conductive pads 204 of the substrate 202 may include any metal, for example, tin ("Sn"), silver ("Ag"), copper ("Cu"), lead ("Pb"), nickel ("Ni"), gold ("Au"), titanium ("Ti"), indium ("In"), zinc ("Zn"), platinum ("Pt"), or any combination thereof. For yet another embodiment, a solder is pre-applied to the conductive pads 204 of the substrate 202 before a chip attachment. The conductive pads 204 may be formed on the substrate 202 by using one of the techniques known to one of ordinary skill in the art of integrated circuits fabrication.

Figure 6:
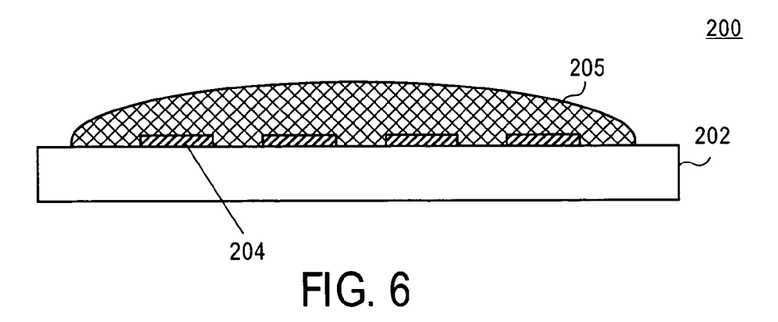
FIG. 6 is a view similar to FIG. 5, after placing a no-flow underfill material on the substrate.

FIG. 6 is a view similar to FIG. 5, after placing the no-flow underfill material 205 on the substrate 202 to form the flip chip assembly 200. As shown in FIG. 6, the no-flow underfill material 205 covers the substrate 202 including conductive pads 204. For an embodiment, the no-flow underfill material 205 includes, by weight, from about 1% to about 15% of epoxy resin, from about 1% to about 15% a epoxy hardener, from about 1% to about 6% of a fluxing agent, from about 20% to about 70% of a silica filler to manage the CTE of the materials, up to about 3% of coupling agent; up to about 3% of adhesion promoter, up to about 3% wetting agent ("wetability modificator") or surfactant, up to about 1% of a pigment, and up to about 1% delute agent, wherein the fluxing agent is latent and does not generate the reactive acid until heated to the activation temperature. In an embodiment, the no-flow underfill material 205 includes an amine-based epoxy hardener, an epoxy resin, and a fluxing agent, wherein the amine-based epoxy hardener includes, for example, at least one of aliphatic amines, aromatic amines, amine monomers, amine oligomers, amine polymers, or any combination thereof; the epoxy resin includes at least one of aliphatic monomers, aromatic monomers, oligomers, polymers, or any combination thereof, and the fluxing agent includes at least one of a stereo hindered anhydride, a stereo hindered acid, a polymer encapsulated acid, a polymer encapsulated anhydride, or any combination thereof. For an embodiment, the amine-based epoxy hardener amount of the no-flow underfill material 205 corresponds stoichiometrically to the amount of the epoxy resin of the no-flow underfill material 205. For an embodiment, the no-flow underfill material 205 on the substrate 202 at room temperature is in a substantially viscous ("semi-liquid") form, wherein the viscosity of the no-flow underfill material 205 at room temperature may be in the approximate range of 500 centipoise ("cp") to 10000 cp. More specifically, viscosity of the no-flow underfill material 205 at room temperature may be between 1000 cp to 2000 cp.

For one embodiment, the no-flow underfill material 205 may be formed, for example, by placing all components of the no-flow underfill material 205, including the epoxy resin, the amine hardener, the fluxing agent, in a predetermined sequence into a high-speed, temperature and vacuum controllable mixing pot, and mixing all the components in the mixing pot to produce a mixture for the no-flow underfill material 205. Next, the mixture for the no-flow underfill material 205 may be degassed using a vacuum pump to remove excessive air blended into the mixture during mixing. Further, the mixture for the no-flow underfill material 205 may be aged in an oven for a predetermined amount of time at a predetermined temperature to form the no-flow underfill material. For one embodiment, the no-flow underfill material 205 may be dispensed on the substrate 202, through a dispensing mechanism using a needle by one of techniques known to one of ordinary skill in the art of semiconductor packaging. For alternate embodiments, the no-flow underfill material 205 may be placed on the substrate 202 by one of jetting techniques using a syringe or printing techniques, for example, a stencil printing, which are known to one of ordinary skill in the art of semiconductor packaging. The no-flow underfill material 205 is placed on the substrate 202 in the amount sufficient to provide a complete adhesion of a chip to the substrate 202 later on in the process.

Figure 7:
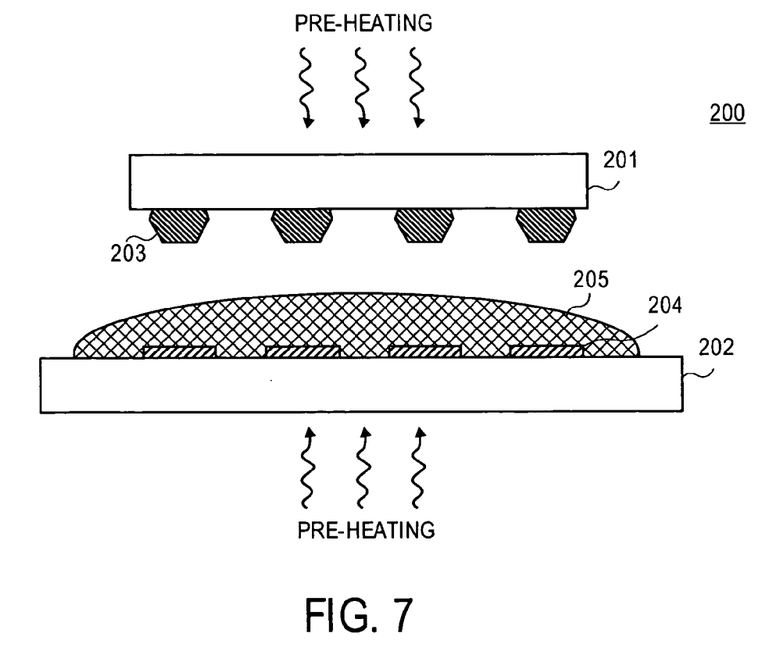
FIG. 7 is a view similar to FIG. 6, after a chip is aligned with the substrate.

FIG. 7 illustrates a chip 201 aligned with a substrate to form the flip chip assembly 200. The chip 201 having one or more contacts ("conductive bumps") is provided and aligned such that each of the conductive bumps 203 of the chip 201 is aligned to each of the respective conductive pads 204 of the substrate 201, as shown in FIG. 7. The conductive bumps 203 are electrically coupled to the inner circuitry of the chip 201. For one embodiment, chip 201 having one or more contacts includes a monocrystalline silicon, which may be a platform for various integrated circuits. For one embodiment, chip 201 having one or more contacts includes an arrangement of transistors and capacitors and includes metal lines for electrical coupling separated by inter-layer dielectric material. For one embodiment, chip 201 is a silicon dye having an integrated circuit hereon, such as, for example, a flash memory embedded controller. For one embodiment, each of the conductive bumps 203 extend from the surface of the chip 201 to a distance in the approximate range of 20 μm to 300 μm and has a diameter in the approximate range of 50 μm to 150 μm. Referring to FIG. 2, for one embodiment, the thickness 207 of the no-flow underfill material 205 on the substrate 202 may be about 50 microns in excess of the height 206 of the conductive bumps 203 of the chip 201 attached to the substrate 202.

For one embodiment, the conductive bumps 203 include a solder and have a reflowing temperature to form solder joints with the respective conductive pads 204 of the substrate 202. For another embodiment, the conductive bumps 203 of the chip 201 may be non-solder bumps. In this case, the solder having the reflowing temperature is pre-applied to the conductive pads 204 of the substrate 202 before the chip attachment to the substrate 202.

For one embodiment, the conductive bumps 203 of the chip 201 include a lead-free conductive material, such as copper ("Cu"), tin-silver ("Sn—Ag") alloy, tin-silver-copper ("Sn—Ag—Cu") alloy, tin-bismuth ("Sn—Bi"), and the like. For another embodiment, the conductive bumps 203 of the chip 201 include Pb—Sn alloy with about 37% of Pb and about 63% of Sn. For yet another embodiment, the conductive bumps 203 include high lead alloy having about 97% of Pb and about 3% of Sn or having about 95% of Pb and about 5% of Sn. For alternate embodiments, the conductive bumps 203 of the substrate 202 may include any conductive material, for example, tin, silver, copper, lead, eutectic alloys, nickel, gold, titanium, indium, zinc, platinum, or any combination thereof, which may be formed on the chip 201 by using one of the techniques known to one of ordinary skill in the art of integrated circuits fabrication.

Next, the chip 201 and the substrate 202 are pre-heated to preliminarily reduce the viscosity of the no-flow underfill material 205 on the substrate 202 to facilitate adhesion of the chip 201 to the substrate 202 and reduce a temperature ramp later on in an attachment process. For one embodiment, the pre-heating temperature is in the approximate range of 60° C.-140°.

Figure 8:
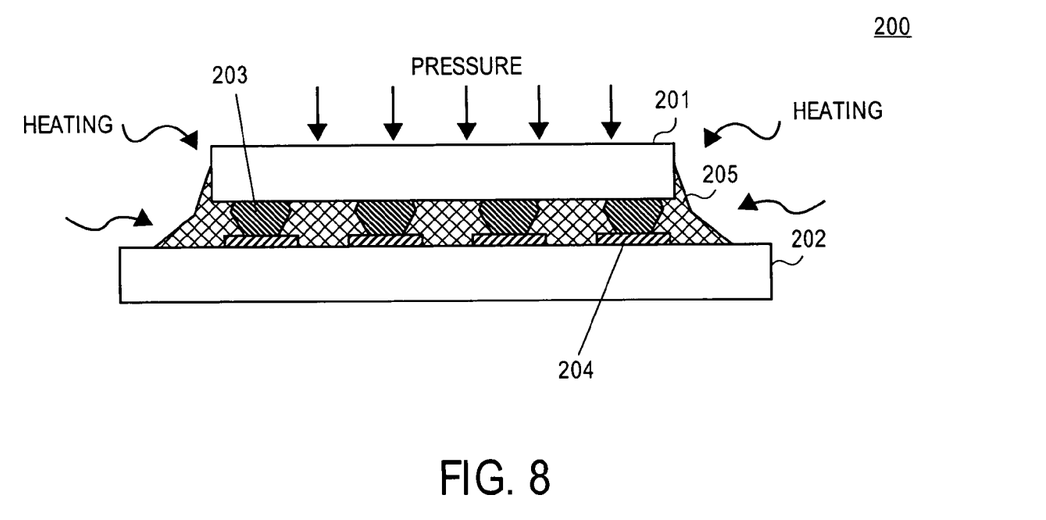
FIG. 8 is a view similar to FIG. 7, after the chip is placed on the substrate.

FIG. 8 is a view similar to FIG. 7, after the chip 201 is placed on the substrate 202. The conductive bumps 203 of the chip 201 are placed on the respective conductive pads 204 of the substrate 202 and the no-flow underfill material 205 fills the space between the chip 201 and the substrate 202, as shown in FIG. 8. For one embodiment, to place the chip 201 on the substrate 202, the pressure is applied to the chip 201, as shown in FIG. 8. For another embodiment, to place the chip 201 on the substrate 202 the pressure is applied to both the chip 201 and the substrate 202. For one embodiment, the pressure applied to the die may be in the approximate range of 0.5 to 10 kilograms per chip ("kg/chip"). Because the conductive pads 204 are initially covered by the no-flow underfill material 205, as shown in FIG. 6, they are not immediately available for solder joint formation with the conductive bumps 203.

To facilitate formation of solder joints between the conductive bumps 203 of the chip 201 and the conductive pads 204 of the substrate 202, the temperature of the assembly 200 is increased, as shown in FIG. 8, to reach the activation temperature ("fluxing temperature") of the no-flow underfill material 205. As the temperature increases, the viscosity of the no-flow underfill material 205 decreases that allows the conductive bumps 203 of the chip 201 to drop into contact with the conductive pads 204 of the substrate 202. For an embodiment, as the temperature increases, the no-flow underfill material 205 between the substrate 202 and the chip 201 reforms, such that it rises around the sides of the chip 201 to form protective side portions 209. When the activation temperature is reached, the previously latent fluxing agent of the no-flow underfill material 205 activates to generate a reactive acid and acts as a flux. The reactive acid produced by the fluxing agent of the no-flow underfill material 205 cleans the surfaces of the conductive bumps 203 and the conductive pads 204 by removing metal oxides that facilitates formation of conductive solder joints. The fluxing temperature of the fluxing agent of the no-flow underfill material 205 is below, but substantially close to a reflowing temperature at which the solder joints between the conductive bumps 203 and the conductive pads 204 are formed such that the fluxing agent does not exhaust prematurely. For one embodiment, the time to complete fluxing by the fluxing agent of the no-flow underfill material 205 is in the approximate range of 2 seconds to 10 minutes. For one embodiment, the assembly 200 is specifically kept for a predetermined amount of time ("soaking time") at the fluxing temperature, for example, between 2 seconds to 10 minutes to complete fluxing of surfaces of the conductive bumps 203 and the conductive pads 204. For one embodiment, the fluxing temperature of the fluxing agent of the no-flow underfill material 205 is between about 20° C. to 80° C. below the reflowing temperature of the solder joints. For one embodiment, to form, for example, lead-free solder joints, the fluxing temperature of the fluxing agent of the no-flow underfill material 205 is in the approximate range of 150° C. to 240° C. For one embodiment, the reactive acid generated by the fluxing agent at the fluxing temperature cleans the surfaces of the conductive bumps and pads and in the same time reacts with amine-based epoxy groups of the no-flow underfill material 205 to become a part of the 3-dimensional ("3D") cross-linking network of the no-flow underfill material 205. For one embodiment, by-products resulted from activation of the fluxing agent at the fluxing temperature, for example, melted polymeric shell of the capsule 402, also become a part of the 3-dimensional ("3D") cross-linking network of the no-flow underfill material 205.

Figure 9:
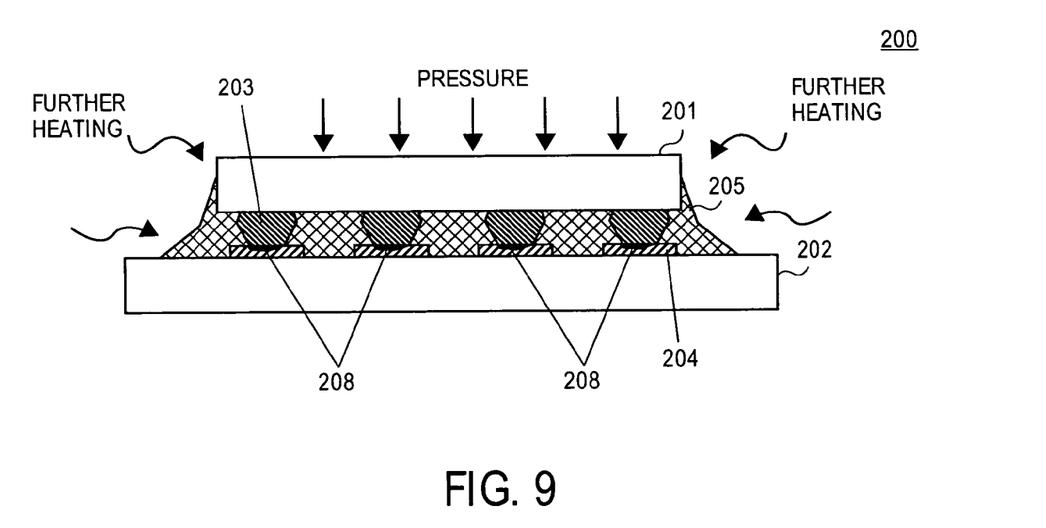
FIG. 9 is a view similar to FIG. 8, after the temperature is increased to form conductive joints.

Next, the temperature of the assembly 200 is further increased, as shown in FIG. 9, until the reflowing temperature is reached to form solder joints 208 to electrically couple the chip 201 with the substrate 202 through conductive bumps 203 and the conductive pads 204. Once the reflowing temperature is reached, solder wets-out onto the conductive pads 204 of the substrate 202 to form solder joints with conductive bumps 203. For alternate embodiments, as described with respect to FIGS. 5 and 6 above, the solder may be included into conductive bumps 203, pre-applied onto the conductive pads 204, or both. For one embodiment, to form solder joints 208, which include Sn—Ag, the reflowing temperature is in the approximate range of 240° C. to 260° C. For another embodiment, to form solder joints 208 including, for example, Pb—Sn eutectic alloys, the reflowing temperature may be in the approximate range of 210° C. to 230° C. For one embodiment, for example, for thermo-compression chip bonding, the temperature of the assembly is first increased with a ramp in the approximate range of 25° C. to 50° C. per second to reach the fluxing temperature of the no-flow underfill material 205, then the temperature stays at the fluxing point for a predetermined amount of soaking time, which may be between 2 seconds and 10 minutes, and then the temperature is increased again with the ramp in the approximate range of 25° C. to 50° C. per second to reach the reflowing temperature. For an embodiment, the viscosity of the no-flow underfill material 205 at the reflowing temperature to form solder joints may be substantially low, for example, in the approximate range of 100 cp to 300 cp.

Further, the temperature of the assembly 200 is decreased from the reflowing temperature to cure the no-flow underfill material 205. The no-flow underfill material 205 is cured to form about 100% cross-linked 3D polymer structure. For an embodiment, the curing temperature of the no-flow underfill material 205 is above, but substantially close to the fluxing temperature. More specifically, the curing temperature of the no-flow underfill material 205 may be in the approximate range of 150° C. to 210° C. and the curing time may be between 1 to 3 hours.

Figure 10:
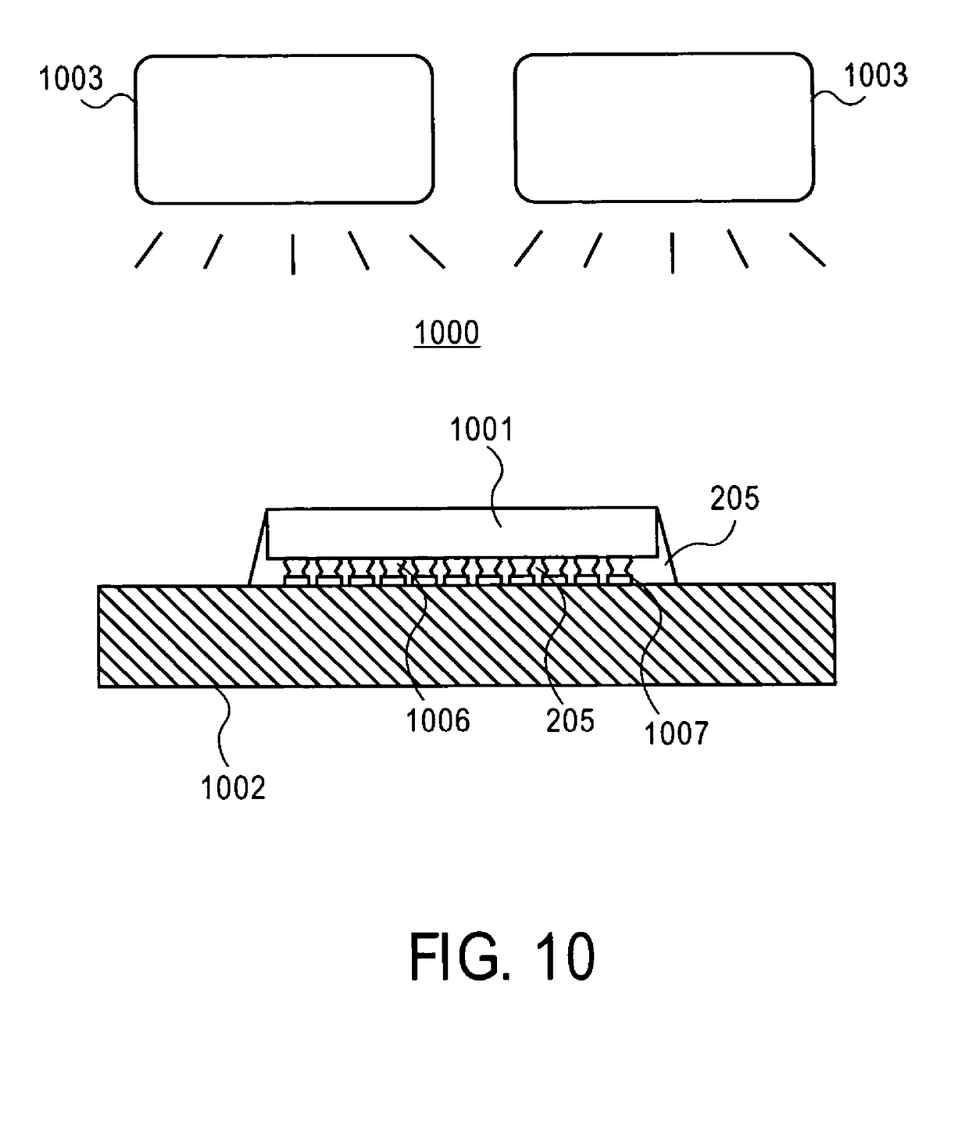
FIG. 10 illustrates a chip positioned on a package substrate with an no-flow underfill material and placed in a reflow apparatus according to another embodiment of the invention.

FIG. 10 illustrates a chip 1001 having conductive bumps 1006 positioned on a package substrate 1002 having conductive pads 1007 and placed in a reflow apparatus 1000 according to another embodiment of the invention. The reflow apparatus 1000 may be a conventional reflow oven for regular chip attachment. As shown in FIG. 10, the no-flow underfill material 205 fills the space between the substrate 1002 and the chip 1001. The assembly 1005 including the chip 1001, the substrate 1002, and the no-flow underfill material 205 is heated by heating elements 1003, as shown in FIG. 10. The heating elements 1003 may include heated coils, a radio frequency source, or other source of heat. For one embodiment, the temperature in the reflow apparatus is first increased with the ramp in the approximate range of 1° C. to 20° C. per minute to reach the fluxing temperature of the no-flow underfill material 205, then the temperature stays at the fluxing point for a predetermined amount of soaking time, which may be between 2 seconds and 10 minutes, and then the temperature is increased again with the ramp in the approximate range of 1° C. to 20° C. per minute to reach the reflowing temperature.

Figure 11:
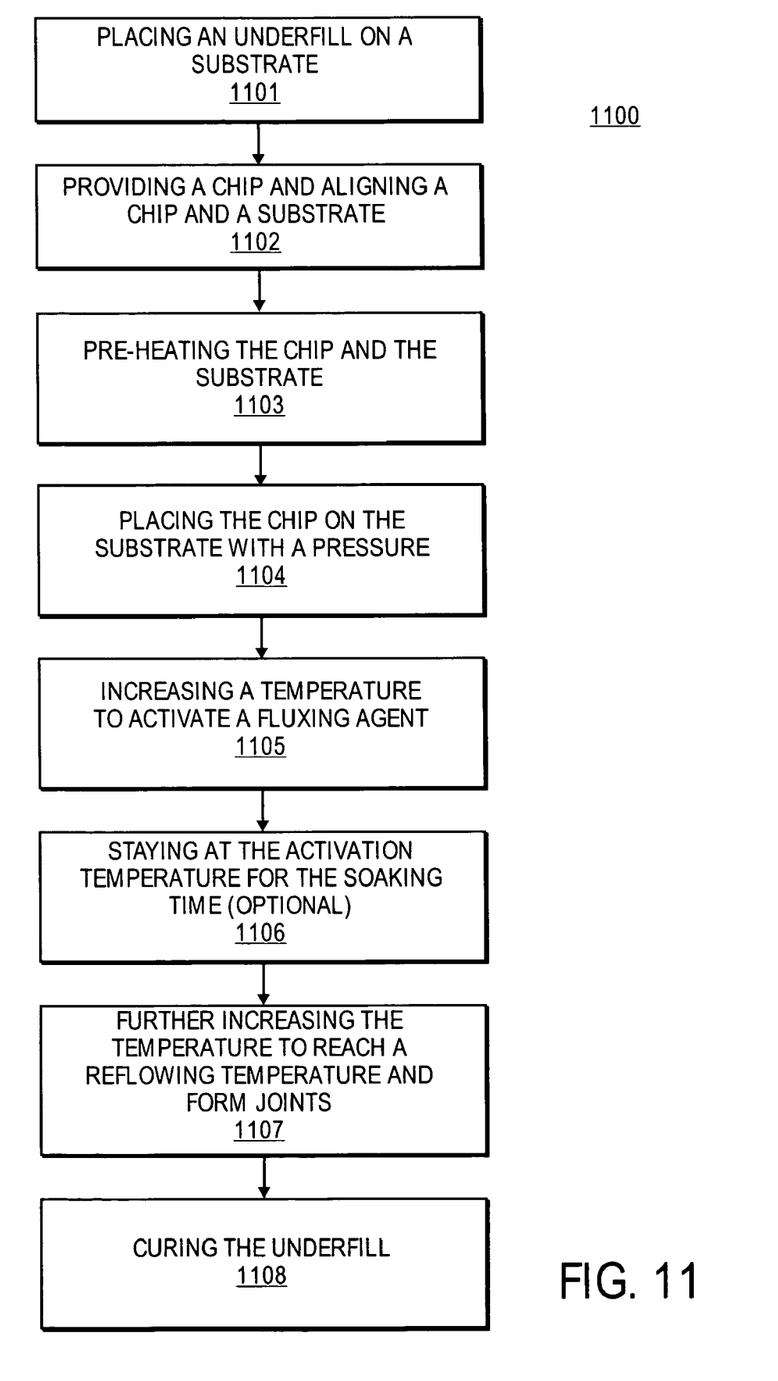
FIG. 11 is a flowchart of a process of attaching a chip to a substrate summarizing one embodiment of the invention.

FIG. 11 shows a flowchart of a process of attaching a chip to a substrate described herein above according to one embodiment of the invention. The process 1100, shown in FIG. 11, begins at operation 1101 in which a no-flow underfill material is placed on a substrate. Next, at operation 1102, a chip is provided and aligned to a substrate. Then, the chip and the substrate are pre-heated 1103 and the chip is placed 1104 on the substrate with a pressure. Next, the temperature of the chip and the substrate with the no-flow underfill material in between is increased 1105 to activate the fluxing agent of the no-flow underfill material. Optionally, the temperature is kept 1106 at the activation temperature for a soaking time to complete fluxing. Next, the temperature is further increased 1107 to reach the reflow temperature to form solder joints. Further, the temperature is decreased 1108 to cure the no-flow underfill material. For an embodiment, the process 1100 may be performed with the assembly 200 in a nitrogen environment to protect solder joints 208 and the no-flow underfill 205 from contamination by impurities.

For alternate embodiments, the no-flow underfill materials and methods described above may be used in any application, which needs the underfill material to couple together devices, for example, to couple a device to a motherboard of a computer, to a package substrate, to a PCB board, to an interposer, or to any combination thereof.

What is claimed is:

1. A method of attaching a chip to a substrate, comprising:
   placing an underfill material on the substrate having one or more conductive pads, wherein the underfill material comprises an epoxy resin, an amine-based epoxy hardener, and a fluxing agent that is enclosed into a polymer capsule, wherein the fluxing agent activates at a fluxing temperature and is neutral and does not react with the amine-based epoxy hardener below the fluxing temperature;
   providing the chip having one or more conductive bumps;
   pre-heating the chip and the substrate;
   placing the chip on the substrate such that the one or more conductive bumps are placed on the one or more conductive pads and the underfill material is between the chip and the substrate;
   increasing the temperature of the chip and the substrate to reach the fluxing temperature to activate the fluxing agent by breaking the polymer capsule; and
   further increasing the temperature of the chip and the substrate to reach the reflowing temperature to form conductive joints between the one or more conductive bumps and the one or more conductive pads.

2. The method of claim 1, wherein the fluxing temperature is about 20° C. to 80° C. below the reflowing temperature to form conductive joints between the one or more conductive bumps and the one or more conductive pads.

3. The method of claim 1, wherein the fluxing temperature is in the approximate range of 150° C. to 240° C.

4. The method of claim 1, wherein the reflowing temperature to form conductive joints between the one or more conductive bumps and the one or more conductive pads is in the approximate range of 230° C. to 260° C.

5. The method of claim 1, wherein the one or more conductive bumps and the one or more conductive pads to form conductive joints are lead-free.

6. The method of claim 1, wherein at least one of the one or more conductive bumps and the one or more conductive pads to form conductive joints includes copper.

7. The method of claim 1 further comprising:
   keeping the chip and the substrate at a fluxing temperature for a soaking time before further increasing the temperature.

8. The method of claim 1 further comprising curing the underfill material at a curing temperature.

9. The method of claim 8, wherein curing temperature is in the approximate range of 150° C. to 210° C.

10. A method, comprising:
    providing an underfill material on a substrate, the underfill material includes an amine based epoxy hardener, and a fluxing agent, which activates at a fluxing temperature and is neutral and does not react with the amine-based epoxy hardener at temperatures below the fluxing temperature, wherein the fluxing agent is enclosed into a polymer capsule;
    placing a device on the substrate, wherein the underfill material is sandwiched between the device and the substrate; and
    increasing a temperature of the underfill to activate the fluxing agent by breaking the polymer capsule to enable a conductive joint formation between the device and the substrate.

11. The method of claim 10, further comprising:
    further increasing the temperature of the device and the substrate including the underfill to form one or more conductive joints between the substrate and the device.

12. The method of claim 11, wherein the one or more conductive joints are formed at a reflowing temperature, wherein the reflowing temperature is in the approximate range of 230° C. to 260° C. and the fluxing temperature is in the approximate range of 150° C. to 210° C.

13. The method of claim 10, wherein the fluxing agent activates at the fluxing temperature by generating a reactive acid to remove metal oxides.

* * * * *